(12) United States Patent
Tseng

(10) Patent No.: US 6,277,739 B1
(45) Date of Patent: Aug. 21, 2001

(54) METHOD OF FORMING A BARRIER LAYER UNDERLYING A TUNGSTEN PLUG STRUCTURE IN A HIGH ASPECT RATIO CONTACT HOLE

(75) Inventor: Horng-Huei Tseng, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/697,947

(22) Filed: Oct. 30, 2000

(51) Int. Cl.⁷ ..................................................... H01L 21/44
(52) U.S. Cl. ........................ 438/655; 438/649; 438/672; 438/675; 438/682
(58) Field of Search ..................... 438/655, 625, 438/630, 631, 649, 664, 672, 675, 682

(56) References Cited

U.S. PATENT DOCUMENTS

| | | | |
|---|---|---|---|
| 5,552,340 | | 9/1996 | Lee et al. ............................... 437/190 |
| 5,885,896 | * | 3/1999 | Thakur et al. ......................... 438/630 |
| 5,899,741 | * | 5/1999 | Tseng et al. ........................... 438/630 |
| 6,100,186 | * | 8/2000 | Hill ........................................ 438/648 |
| 6,177,338 | * | 1/2001 | Liaw et al. ............................. 438/629 |
| 6,180,513 | * | 1/2001 | Otsuka et al. ......................... 438/630 |
| 6,187,675 | * | 2/2001 | Buynoski .............................. 438/655 |

\* cited by examiner

*Primary Examiner*—Kevin M. Picardat
(74) *Attorney, Agent, or Firm*—George O. Saile; Stephen B. Ackerman

(57) ABSTRACT

A process for forming a metal silicide layer on a conductive region in a semiconductor substrate, located at the bottom of a high aspect ratio contact hole, and for selectively forming a barrier layer on the underlying metal silicide layer, has been developed. After opening a high aspect ratio contact hole in an insulator layer, titanium ions are directionally implanted into a top portion of the conductive region, exposed at the bottom of the high aspect ratio contact hole. An anneal procedure, performed in a nitrogen containing ambient, results in the selective formation of a metal silicide layer, such as titanium disilicide, on the conductive region, and results in the selective formation of a barrier layer, such as titanium nitride, on the underlying metal silicide layer. Formation of a metal plug structure, in the high aspect ratio contact hole, overlying and contacting the underlying barrier layer, followed by formation of an overlying metal interconnect structure, is then accomplished.

19 Claims, 3 Drawing Sheets

METHOD OF FORMING A BARRIER LAYER UNDERLYING A TUNGSTEN PLUG STRUCTURE IN A HIGH ASPECT RATIO CONTACT HOLE

BACKGROUND OF THE INVENTION (1) Field of the Invention

The present invention relates to methods used to form semiconductor devices, and more specifically to a method used to form a barrier layer in a high aspect ratio contact hole, to protect an underlying metal silicide layer from processing conditions used during deposition of an overlying refractory metal layer.

(2) Description of Prior Art

The use of metal silicide layers, located overlying conductive regions in a semiconductor substrate and underlying metal interconnect structures, has allowed decreased metal line resistance, and thus improved semiconductor device performance to be realized via the reduction in performance degrading resistance—capacitance (RC), values. However the use of sub-quarter micron features, used with aggressive semiconductor device designs, have resulted in the creation of high aspect ratios contact holes in insulator layers, which can create problems when attempting to form metal silicide layers, on conductive regions, exposed at the bottom of these high aspect ratio contact holes. The ability to form a metal silicide layer, and an overlying barrier layer needed to protect the metal silicide layer from subsequent process steps such as deposition of a refractory metal layer, becomes more difficult as the aspect ratio of the contact hole increases. This invention will teach a novel method of forming these layers in deep, narrow diameter, contact holes, via directionally implanting the metal component needed for both the metal silicide layer, and overlying barrier layer, directly into a conductive region of the semiconductor substrate, exposed at the bottom of the contact hole. Prior art such as Lee et al, in U.S. Pat. No. 5,552,340, describe a method of forming a barrier layer, overlying a metal silicide layer, located at the bottom of a contact hole, via vapor deposition of the metal layer needed for both silicide and barrier formation. The metal deposition procedure used in this prior art, in addition to difficulties encountered with uniform deposition at the bottom of high aspect ratio contact holes, also results in deposition of metal on the sides of the contact hole which either has to be subsequently remove, or remains to limit the space in the contact hole to be occupied by a low resistance metal plug structure. The present invention however offers the advantage of directionally placing the metal source at the bottom of a high aspect ratio contact hole, without metal being formed on, and than having to be removed, from the sides of the contact hole.

SUMMARY OF THE INVENTION

It is an object of this invention to form a metal silicide layer on a conductive region in a semiconductor substrate, exposed at the bottom of a high aspect ratio contact hole.

It is another object of this invention to selectively form a barrier layer on the metal silicide layer, located at the bottom of the high aspect ratio contact hole.

It is still another object of this invention to form the metal silicide layer, located at the bottom of a high aspect ratio contact hole, via implantation of metal ions into a conductive region exposed in the bottom of the high aspect ratio contact hole, and to selectively form the overlying barrier layer, during an anneal cycle performed in a nitrogen containing ambient.

In accordance with the present invention a method of selectively forming a metal silicide layer, and an overlying barrier layer, on a conducive region in a semiconductor substrate, exposed at the bottom of a high aspect ratio contact hole, is described. A first embodiment of this invention entails formation of a high aspect ratio contact hole, opened in an insulator layer, exposing a conductive region in a semiconductor substrate. Metal ions are next directionally implanted into a top portion of the exposed conductive region, as well as into the top surface of the insulator layer in which the high aspect ratio contact hole was formed in. An anneal procedure, performed in a nitrogen ambient, results in the formation of a metal silicide layer on the conductive region exposed at the bottom of the high aspect ratio contact hole, and also results in the formation of a barrier layer, comprised of the implanted metal and nitrogen, overlying the metal silicide layer. The metals ions located in a top portion of the insulator layer, remain unreacted. Deposition of a conductive metal layer completely filling the high aspect ratio contact hole is followed by removal of the portion of the conductive metal layer located on the top surface of the insulator layer, resulting in a conductive metal plug structure, in the high aspect ratio contact hole, overlying the barrier layer—metal silicide layer, located at the bottom of the high aspect ratio contact hole. Formation of a metal interconnect structure, overlying and contacting the conductive metal plug structure, is preceded by a pre-clean procedure which removes a top portion of the insulator layer, containing the unreacted metal ions.

A second embodiment of this invention entails the deposition of a second barrier layer, along with the deposition of a conductive metal layer, completely filling the high aspect ratio contact hole, and overlying and contacting a first barrier layer—metal silicide layer, located at the bottom of the high aspect ratio contact hole. Removal of the second barrier layer and of the conductive metal layer, from the top surface of the insulator layer, result in the definition of a conductive metal plug structure and a second barrier layer, overlying the selectively formed first barrier layer—metal silicide layer, located at the bottom of a high aspect ratio contact hole. A pre-metal clean, followed by metal deposition results in the metal interconnect structure, overlying and contacting the conductive metal plug structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
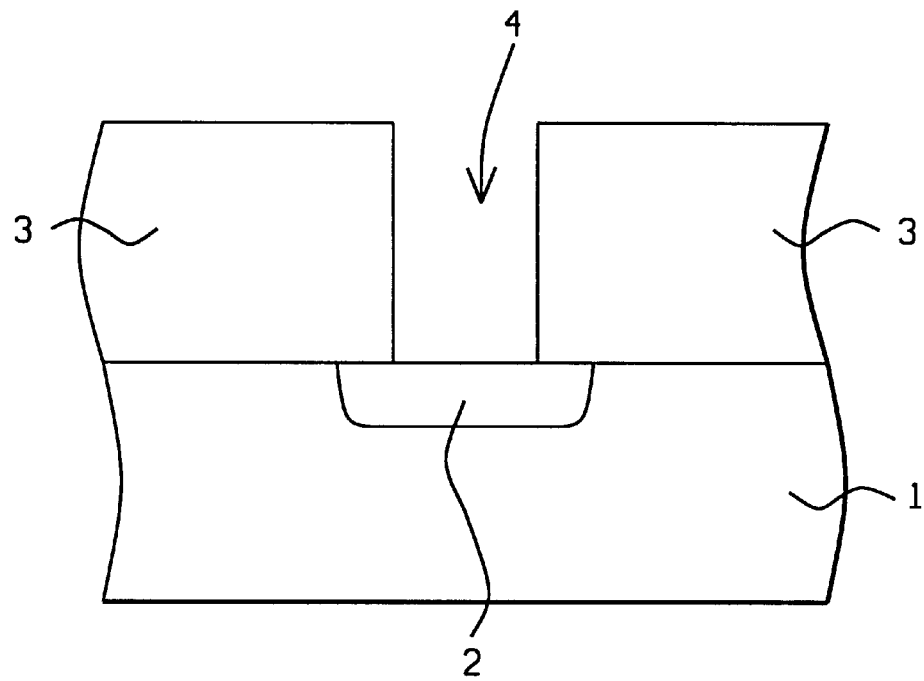
FIGS. 1–4, which schematically, in cross-sectional style, describe key stages of fabrication used for a first embodiment of this invention featuring the selective formation of a metal silicide layer and an overlying barrier layer, on a conductive region exposed at the bottom of a high aspect ratio contact hole.

The method of selectively forming a metal silicide layer, and an overlying barrier layer, on a conductive region in a semiconductor substrate, exposed in the bottom of a high aspect ratio contact hole, will now be described in detail. A semiconductor substrate 1, comprised of P type, single crystalline silicon, with a <100> crystallographic orientation, is used and schematically shown in FIG. 1. A conductive region 2, such as an N type source/drain region of metal oxide semiconductor field effect transistor (MOSET), with a surface concentration between about 1E18 to 1E21 atoms/cm$^3$ is formed in semiconductor substrate 1, followed by deposition of insulator layer 3, comprised of silicon oxide, or boro-phosphosilicate glass (BPSG). Insulator layer 3, is obtained via low pressure chemical vapor deposition (LPCVD), or plasma enhanced chemical vapor deposition (PECVD), procedures, at a thickness between about 3000 to 12000 Angstroms. A photoresist shape, not shown in the drawings, is used as a mask to allow an anisotropic, reactive ion etching (RIE), procedure, using CHF$_3$ as an etchant, to define contact hole 4, in insulator layer 3, exposing a portion of the top surface of conductive region 2. The diameter of contact hole 4, is between about 0.05 to 2.0 um, resulting in an aspect ratio for contact hole 4, between about 2 to 10. The result of forming the high aspect ratio contact hole is schematically shown in FIG. 1.

Figure 2:
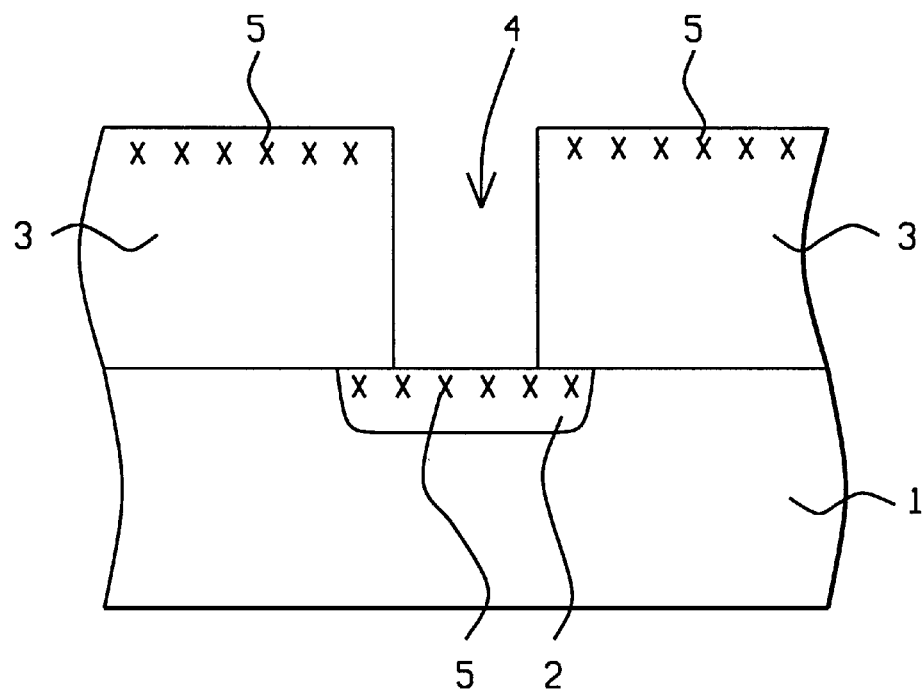

To successfully form a metal silicide layer, and an overlying barrier layer, only on conductive region 2, exposed at the bottom of high aspect ratio contact hole 4, a metal ion implantation procedure, and an anneal in a nitrogen ambient, will be used for the selective formation procedure. Metal ions 5, such as titanium ions, are implanted into a top portion of conductive region 2, exposed at the bottom of high aspect ratio contact hole 4, using an implant angle between about 0 to 7 degrees. The implantation procedure also places titanium ions 5, in a top portion of insulator layer 3. The result of this procedure is schematically shown in FIG. 2. An ion implantation procedure was chosen to directionally place metal, or titanium ions 5, only into conductive region 2, located at the bottom of high aspect ratio contact hole 4. Other procedures of supplying metal for formation of a subsequent metal silicide layer, such as a less directional plasma vapor deposition procedure, can experience difficulties in placing metal at the desired location, the bottom of the high aspect ratio contact hole. In addition a plasma vapor deposition procedure would also deposit metal on the sides of the high aspect ratio contact hole, decreasing the width of the narrow, contact hole, thus not allowing a sufficient level of filling of the high conductivity plug to ensue. If desired metal ions 5, can be cobalt, nickel, or tantalum ions.

Figure 3:
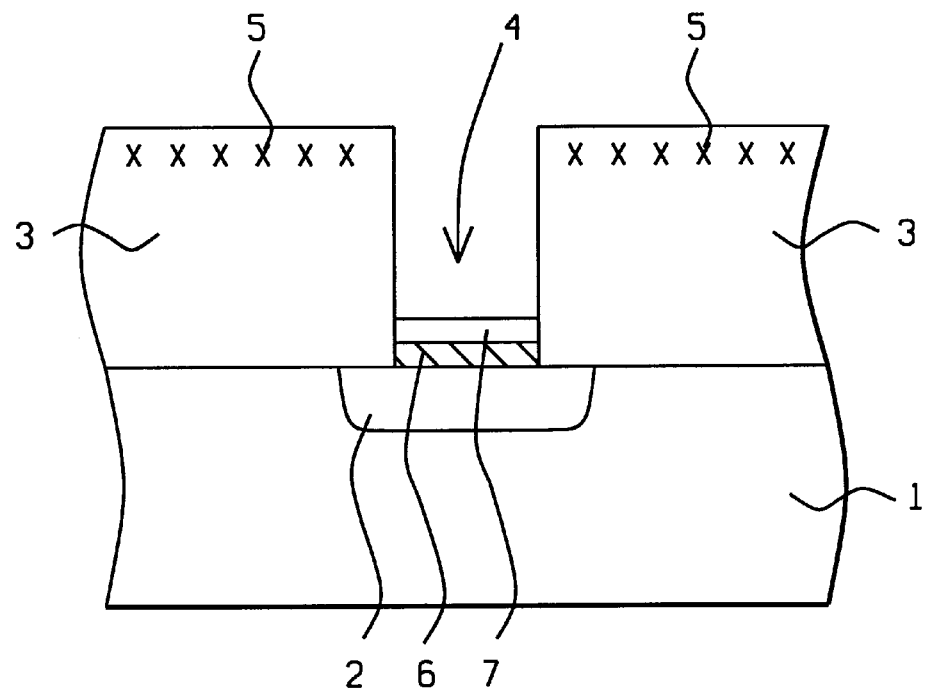

An anneal procedure, performed in a nitrogen containing ambient, such as N$_2$, NO, N$_2$O, or NH$_3$, is next employed at a temperature between about 600 to 900° C., using either a conventional furnace, or using a rapid thermal anneal (RTA), furnace, to form metal silicide, or titanium disilicide layer 6, at a thickness between about 50 to 500 Angstroms, on the portion of conductive region 2, exposed in high aspect ratio contact hole 4. The same anneal procedure results in the selective formation of barrier layer, or titanium nitride layer 7, at a thickness between about 20 to 200 Angstroms, on the top surface of metal silicide layer 6. The combination of a directional metal implant procedure, and an anneal in a nitrogen ambient, results in the selective formation of barrier layer 7, only on the top surface of metal silicide layer 6, not on the sides of high aspect ratio contact hole 4, which again would limit the width of a subsequent, high conductivity metal plug fill. Metal ions 5, located in a top portion of insulator layer 5, remain unreacted during the anneal procedure. The result of this procedure is schematically shown in FIG. 3.

Figure 4:
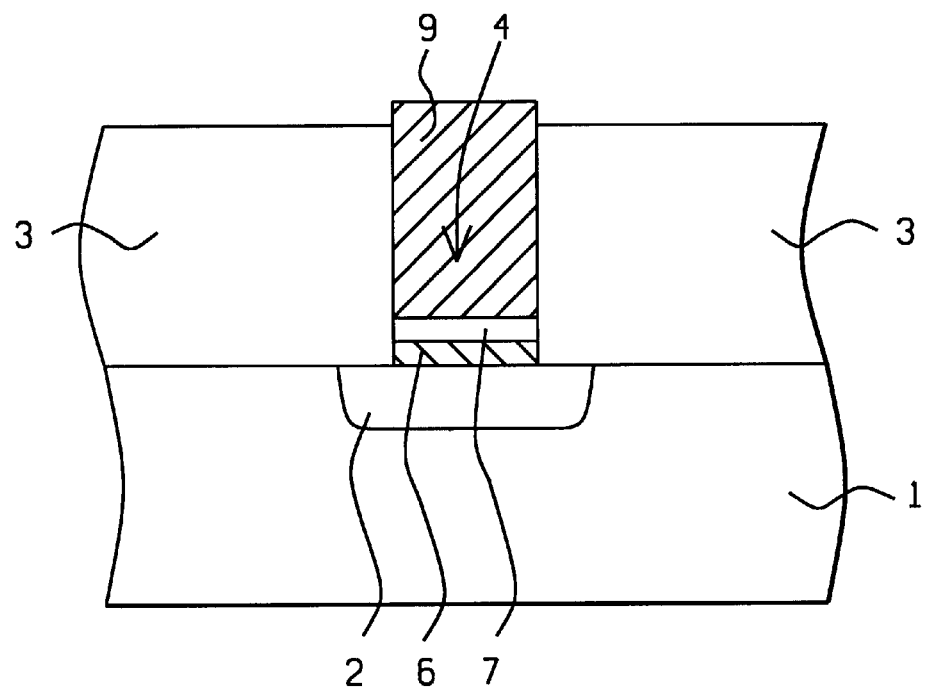

Barrier layer 7, is needed to protect metal silicide layer 6, from reactants used to form metal plug structure 9, in high aspect ratio contact hole 4. A metal layer such as tungsten, is deposited using LPCVD procedures, to a thickness between about 1000 to 5000 Angstroms, completely filling light aspect ratio contact hole 4, using tungsten hexafluoride as a source for tungsten. If desired a metal silicide layer, such as tungsten silicide can be used in place of the metal or tungsten layer, with the tungsten silicide layer obtained via LPCVD procedures, using tungsten hexafluoride and silane as reactants. Removal of portions of the metal layer, located on the top surface of insulator layer 3, is accomplished via a chemical mechanical polishing (CMP), procedure, or via a selective RIE procedure, using Cl$_2$ or SF$_6$ as an etchant for the metal layer, resulting in metal plug structure 9, in high aspect ratio contact hole 4. After removal of unwanted metal from the top surface of insulator layer 3, a post—clean procedure, comprised with a buffered hydrofluoric acid cycle, removes the top portion of insulator layer 3, the portion comprised with unreacted metal ions 5, resulting in the top surface of metal plug structure 9, raised to a level between 50 to 100 Angstroms, above the top surface of insulator layer 3. This is schematically shown in FIG. 4. Again as previously mentioned the ability to selectively form the barrier layer, and the metal silicide layer, at the bottom of, but not on the sides of the high aspect ratio contact hole, allows a wider, and thus more conductive, metal plug structure to be formed in the high aspect ratio contact hole. An overlying metal interconnect structure, not shown in the drawings, is next formed overlying, and contacting, metal pug structure 9.

Figure 5:
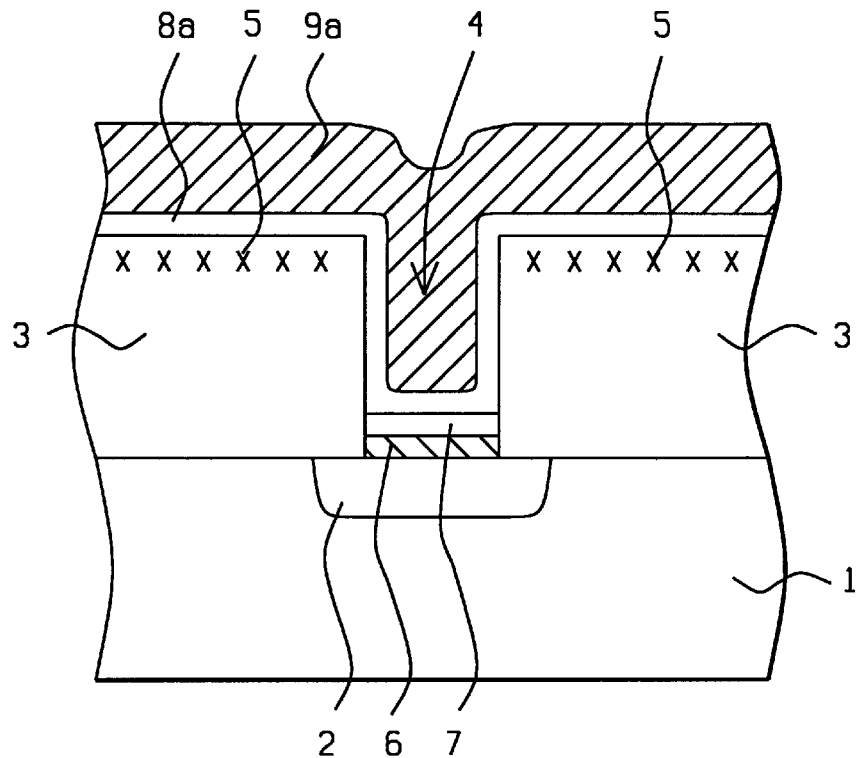
FIGS. 5–6, which schematically, in cross-sectional style, describe key stages of fabrication used for a second embodiment of this invention featuring the selective formation of a metal silicide layer and an overlying first barrier layer, on a conductive region exposed at the bottom of a high aspect ratio contact hole, followed by deposition of a second barrier layer, overlying the first barrier layer and lining the sides of the high aspect ratio contact hole.
Figure 6:
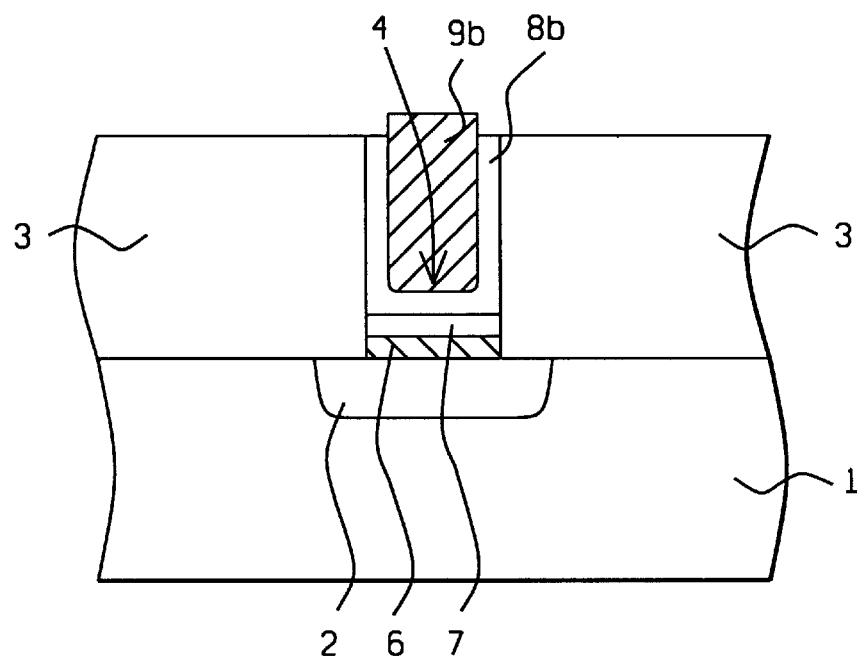

A second embodiment of this invention is schematically described in FIGS. 5–6. In this embodiment deposition of metal, or tungsten layer 9a, in high aspect ratio contact hole 4, comprised with barrier layer 7, and underlying metal silicide layer 6, located at the bottom of the contact hole, is preceded by the deposition of second barrier layer 8a. Second barrier 8a, is obtained via plasma vapor deposition, or LPCVD procedures, at a thickness between about 100 to 1000 Angstroms, and used to offer additional protection from the reactants or by-products used, or formed, during a subsequent metal deposition procedure. This procedure however reduces the volume occupied by the metal plug fill structure. Metal layer 9a, such as tungsten, is obtained via LPCVD procedures, at a thickness between about 1000 to 5000 Angstroms, completely filling high aspect ratio contact hole 4. This is schematically shown in FIG. 5.

Removal of portions of both metal layer 9a, and of second barrier layer 8a, again accomplished via a CMP or a selective RIE procedure, result in metal plug structure 9b, encased in second barrier layer 8b, in high aspect ratio contact hole 4, with this structure overlying, and contacting, first barrier layer 7, and metal silicide layer 6, located at the bottom of high aspect ratio contact hole 4. Post cleans, again performed using a buffered hydrofluoric acid component, remove the top portion of insulator layer 3, containing unreacted metal ions 5, resulting in the top surface of metal plug structure between about 50 to 100 Angstroms higher than the top surface of insulator layer 3. This is schematically shown in FIG. 6. A metal interconnect structure, not shown in the drawings, is formed overlying, and contacting metal plug structure 9b.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal silicide layer, and an overlying barrier layer, on a conductive region in a semiconductor substrate, exposed at the bottom of a contact hole, comprising the steps of:

providing said conductive region, in said semiconductor substrate;

depositing an insulator layer;

opening a contact hole in said insulator layer, exposing a portion of top surface of said conductive region, located at the bottom of said contact hole;

implanting metal ions into a top portion of said conductive region, exposed at bottom of said contact hole, and into a top portion of said insulator layer;

performing an anneal procedure in a nitrogen containing ambient to form said metal silicide layer on said conductive region, and to selectively form overlying, said barrier layer, on said metal silicide layer, with said barrier layer formed from said metal ions, and from nitrogen available in said nitrogen containing ambient, while said metal ions in said top portion of said insulator layer remain unreacted;

forming a metal plug structure in said contact hole, overlying and contacting said barrier layer located on said metal silicide layer, removing said top portion of said insulator layer, comprised with said unreacted metal ions; and forming a metal interconnect structure, overlying and contacting top surface of said metal plug structure.

2. The method of claim 1, wherein said insulator layer is a silicon oxide layer, or a borophosphosilicate glass layer, obtained via LPCVD or PECVD procedures at a thickness between about 3000 to 12000 Angstroms.

3. The method of claim 1, wherein diameter of said contact hole is between about 0.05 to 2.0 um, resulting in an aspect ratio for said contact hole between about 2 to 10.

4. The method of claim 1, wherein said metal ions are titanium ions, implanted at an angle between about 0 to 7 degrees.

5. The method of claim 1, wherein said anneal procedure is performed at a temperature between about 600 to 900° C., in a conventional furnace or in a rapid thermal anneal furnace.

6. The method of claim 1, wherein said nitrogen containing ambient is comprised of either $N_2$, NO, $N_2O$, or $NH_3$.

7. The method of claim 1, wherein said metal silicide layer is a titanium disilicide layer.

8. The method of claim 1, wherein said barrier layer is a titanium nitride layer.

9. The method of claim 1, wherein said metal plug structure is comprised from a tungsten layer, obtained via LPCVD procedures at a thickness between about 1000 to 5000 Angstroms, then defined via a chemical mechanical polishing procedure, or via a selective RIE procedure, using $Cl_2$ or $SF_6$ as an etchant for tungsten.

10. The method of claim 1, wherein said top portion of said insulator layer, containing unreacted metal ions, is removed using a buffered hydrofluoric acid solution.

11. A method of selectively forming a titanium nitride barrier layer on an underlying titanium disilicide layer that in turn is formed on a portion of a conductive region in a semiconductor substrate, exposed at the bottom of a high aspect ratio contact hole, comprising the steps of:

providing said conductive region in said semiconductor substrate;

depositing an insulator layer;

performing an anisotropic dry etch procedure to form said high aspect ratio contact hole in said insulator layer, exposing a portion of the top surface of said conductive region, located at the bottom of said high aspect ratio contact hole;

performing an ion implantation procedure to implant titanium ions into a top portion of said conductive region, exposed at the bottom of said high aspect ratio contact hole, and into a top portion of said insulator layer;

performing an anneal procedure in a nitrogen containing ambient, to form said titanium disilicide layer on said conductive region, exposed at the bottom of said high aspect ratio contact hole, and selectively forming said titanium nitride barrier layer on said titanium disilicide layer, while said titanium ions, in said top portion of said insulator layer, remain unreacted;

depositing a tungsten layer completely filling said high aspect ratio contact hole;

removing portions of said tungsten layer from the top surface of said insulator layer, defining a tungsten plug structure in said high aspect ratio contact hole, overlying and contacting said titanium nitride barrier layer located at the bottom of said high aspect ratio contact hole;

performing a wet etch dip procedure to remove said top portion of said insulator layer, comprised with said unreacted titanium ions; and forming a metal interconnect structure, overlying and contacting said tungsten plug structure.

12. The method of claim 11, wherein said insulator layer is a silicon oxide layer, or a boro-phosphosilicate glass layer, obtained via LPCVD or PECVD procedures at a thickness between about 3000 to 12000 Angstroms.

13. The method of claim 11, wherein diameter of said high aspect ratio contact hole is between about 0.05 to 2.0 um, resulting in an aspect ratio between about 2 to 10.

14. The method of claim 11, wherein said titanium ions are implanted at an implant angle between about 0 to 7 degrees.

15. The method of claim 11, wherein said anneal procedure is performed at a temperature between about 600 to 900° C., in a conventional furnace or in a rapid thermal anneal furnace.

16. The method of claim 11, wherein nitrogen component, in said nitrogen containing ambient, is chosen from a group that includes $N_2$, NO, $N_2O$, or $NH_3$.

17. The method of claim 11, wherein said tungsten layer is obtained at a thickness between about 1000 to 5000 Angstroms.

18. The method of claim 11, wherein said tungsten plug structure is defined via a chemical mechanical polishing procedure, or via a selective RIE procedure, using $Cl_2$ or $SF_6$ as an etchant for tungsten.

19. The method of claim 11, wherein said wet dip procedure, used to remove said top portion of said insulator layer, containing unreacted metal ions, is performed using a buffered hydrofluoric acid solution.

* * * * *